(12) United States Patent
Ferranti et al.

(10) Patent No.: US 6,249,437 B1
(45) Date of Patent: Jun. 19, 2001

(54) HEAT SINK WITH OFFSET FIN PROFILE

(75) Inventors: Stephen A. Ferranti, Rowlett, TX (US); John Paul Mello, Seekonk, MA (US); Madhu Ganesa-Pillai, Richardson, TX (US); Amanda C. Reeves, Dallas, TX (US); Leon Klafter, Allen, TX (US); Joanne C. Zhang, Plano, TX (US)

(73) Assignee: Tyco Electronics Logistics AG, Steinach/SG (CH)

( * ) Notice: Subject to any disclaimer, the term of this patent is extended or adjusted under 35 U.S.C. 154(b) by 0 days.

(21) Appl. No.: 09/419,174

(22) Filed: Oct. 15, 1999

(51) Int. Cl.$^7$ ...................................................... H05K 7/20
(52) U.S. Cl. .......................... 361/720; 361/704; 361/707; 257/707; 174/15.1; 165/80.3
(58) Field of Search ..................................... 361/700–710, 361/713, 714, 717, 719–723, 687, 695, 690, 692, 732, 749, 752, 756, 778; 257/706–727, 696, 698; 174/16.3, 15.1, 15.2, 252; 165/20.3, 80.4, 185, 80.2, 80.3, 165

(56) References Cited

U.S. PATENT DOCUMENTS

| | | | |
|---|---|---|---|
| D. 275,749 | * 10/1984 | McCarthy | ............................. D13/23 |
| 3,213,324 | * 10/1965 | McAdam | ............................. 317/100 |
| 3,480,837 | * 11/1969 | Feldman | ............................. 317/100 |
| 3,566,959 | * 3/1971 | Koltuniak et al. | ...................... 165/80 |
| 4,611,238 | * 9/1986 | Lewis et al. | ............................. 357/81 |
| 4,970,579 | * 11/1990 | Atdt et al. | ............................. 357/81 |
| 5,218,514 | * 6/1993 | Huynh et al. | ......................... 361/384 |
| 5,285,347 | * 2/1994 | Fox et al. | ............................. 361/385 |
| 5,311,928 | * 5/1994 | Marton | ................................ 165/80.3 |
| 5,518,071 | * 5/1996 | Lee | ...................................... 165/185 |
| 6,053,240 | * 4/2000 | Johnston et al. | .................... 165/80.3 |
| 6,064,570 | * 5/2000 | Wang et al. | ......................... 361/695 |

OTHER PUBLICATIONS

"Handbook of Single–Phase Convective Heat Transfer" by Sadik Kakac, Ramesh K. Shah, Win Aung: 1987; 4 pg.

* cited by examiner

*Primary Examiner*—Leo P. Picard
*Assistant Examiner*—Michael Datskovsky

(57) ABSTRACT

The present invention provides for a heat sink that, in a particularly advantageous embodiment, includes a heat sink body with a spine configured to be oriented parallel with the direction of air flow when the heat sink is coupled to a substrate. The heat sink further includes a first set of cooling fins that are coupled to and extend from the spine along a first common longitudinal axis. At least two of the first set of cooling fins laterally extend from the first common longitudinal axis in a common direction and in an offset relationship to each other.

22 Claims, 5 Drawing Sheets

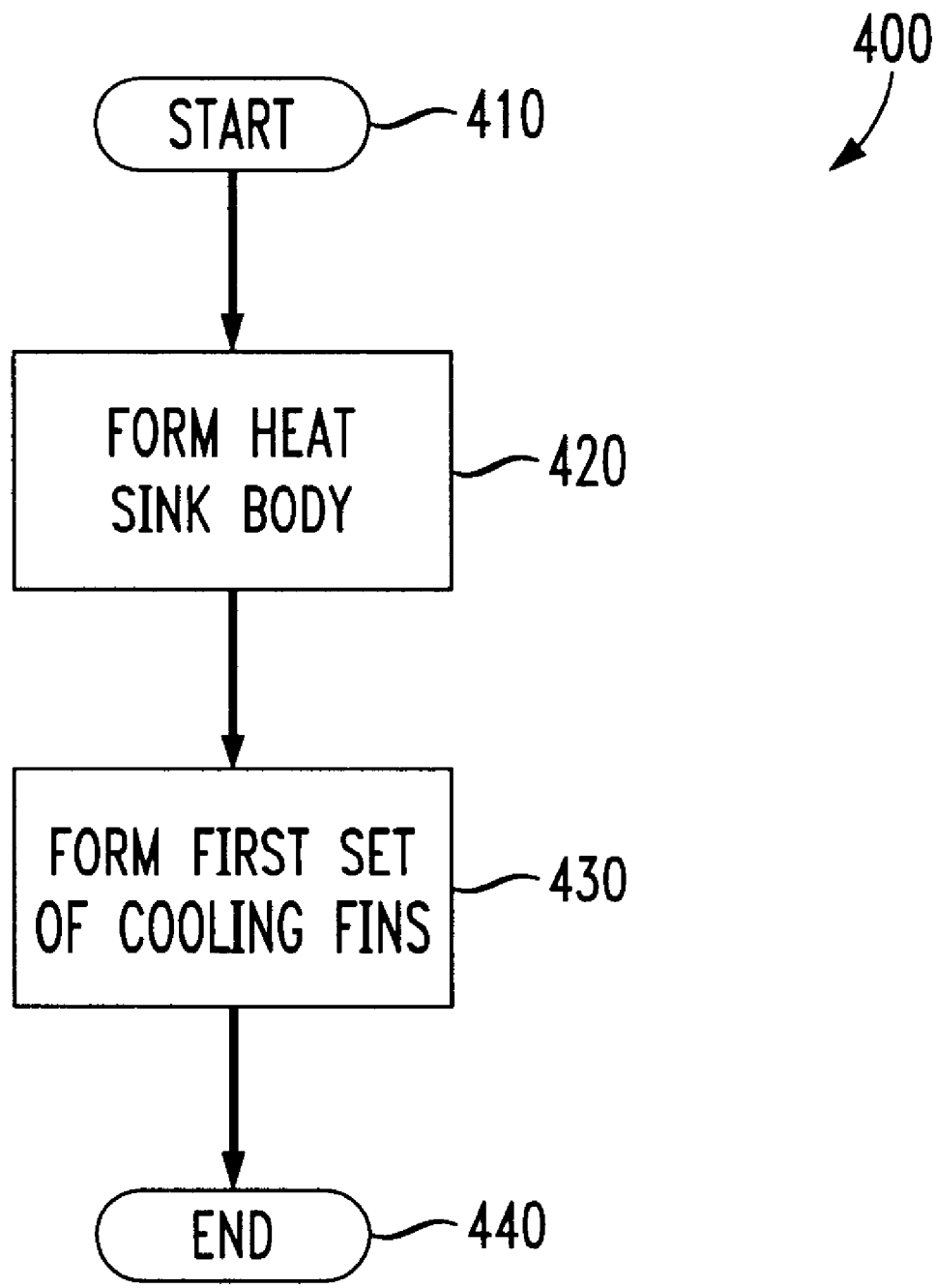

HEAT SINK WITH OFFSET FIN PROFILE

TECHNICAL FIELD OF THE INVENTION

The present invention is directed, in general, to a heat sink and, more specifically, to a heat sink having an offset fin profile for use in electronic and electrical equipment.

BACKGROUND OF THE INVENTION

Miniaturization of components has increased component and power densities in electronic devices to higher levels than ever before. These electronic and electrical components and devices mounted on printed circuit and wiring boards generate considerable operating heat that, unless dissipated to the environment, may result in temperature related circuit or component failure. Experience has shown that nearly 50% of electronic failures are the result of thermal problems. The generally preferred control method is to use a heat sink to transfer component heat to the surrounding ambient air.

A heat sink can be made of any material with favorable heat transfer characteristics, such as copper, aluminum or steel. Aluminum is generally preferred because it is inexpensive, easy to work with, lightweight, and has good heat transfer characteristics. Where aluminum is used, the less alloying material used in the aluminum, the better the heat transfer characteristics.

The heat sink and heat generating component are usually placed in direct contact with one another in order to more efficiently cool the component. In most cases, after the heat sink absorbs component heat, the heat is transferred to the surrounding ambient air by conduction and convection. A typical printed wiring or circuit board may have a number of heat generating devices. That is why it is not unusual to have a number of heat sinks on a single circuit board associated with heat generating devices and components. Because circuits are frequently enclosed in cabinets or other enclosures, a fan is usually employed to move cooling air across the heat sink and facilitate the transfer of heat.

When a number of heat sinks are required, design factors in addition to temperature control must be taken into consideration. When a printed circuit or wiring board requires multiple heat sinks, the board area occupied by heat sinks will often constitute a significant fraction of the total board space. Similarly, a significant fraction of the total volume available to house a circuit will be taken up by heat sinks when a number of heat sinks are required. As the total area on a board required for heat sinks becomes significant, the board real estate allocated to components also becomes affected by heat sink requirements. Of course, the more efficient heat sink designs will require less area and will be lighter than heat sinks that are not as efficient.

In order to facilitate heat transfer, heat sinks frequently have "fins" to increase the total surface area that serves to conduct and convect heat. These fins typically extend into the flow of air and dissipate the conducted heat into the surrounding ambient air by convection. In most cases, the fins on the heat sink that are located closer to the air flow source will provide for more efficient cooling than those located further away from the air flow source. This is true for a number of reasons, one of which is that air flow to the fins at the leading edge is not blocked, whereas the later fins will be in a dead air zone.

Accordingly, what is needed in the art is a heat sink design that will maximize the efficiency of the heat sink device by permitting the maximum amount of cooling air available to contact the maximum cooling fin surface area of the heat sink in order to provide for more efficient cooling of heat generating devices located in an electronics circuit.

SUMMARY OF THE INVENTION

To address the above-discussed deficiencies of the prior art, the present invention provides for a uniquely configured heat sink. In one particularly advantageous embodiment, the heat sink includes a heat sink body with a spine configured to be oriented parallel with the direction of an air flow generated across the heat sink when it is coupled to a substrate. The heat sink also includes a first set of cooling fins coupled to and extending from the heat sink spine along a first common longitudinal axis. At least two of the first set of cooling fins laterally extend from the first common longitudinal axis in a common direction and in an offset relationship to each other.

Thus, in broad scope, the present invention provides for a heat sink with superior cooling capability for use on electronic substrates to which are coupled heat generating components. The heat sink has a set of offset cooling fins extending from a spine into a cooling air flow that is usually forced across the substrate. The cooling fins are offset in order to permit an unimpeded air flow to contact a leading edge on each fin. This novel heat sink device provides an increase in cooling efficiency over heat sinks that are not configured with offset cooling fins.

One embodiment of the present invention provides for the heat sink to be configured to have at least one heat generating component mounted thereon. In another embodiment, the heat sink is comprised of aluminum. In still another embodiment, the heat sink has a mounting foot extending laterally from the spine that is configured to permit the heat sink to be coupled to an electronic substrate.

In another embodiment, the present invention provides for a heat sink with a first set of cooling fins laterally extending from a first common longitudinal axis in a common direction and in an offset relationship to each other. In still another aspect of the invention, the heat sink provides for each of the cooling fins to include a leading face that is oriented substantially perpendicular to the direction of the air flow and in an offset relationship so that an unimpeded air flow impacts the leading face of each cooling fin.

In a particularly useful embodiment of the invention, the heat sink has a second set of cooling fins extending from and coupled to the spine along a second common longitudinal axis. In this embodiment, at least two of the second set of cooling fins extend laterally from the second common longitudinal axis in a common direction and in an offset relationship to each other. Another aspect of this embodiment provides for the common direction to be towards the first common longitudinal axis.

The present invention also provides for a method of manufacturing a heat sink with superior cooling capability for use on an electronic substrate to which are coupled heat generating components. The method, in one embodiment, comprises forming a heat sink body with a spine configured to be oriented parallel with the air flow direction when the heat sink is coupled to a substrate. A first set of cooling fins is formed extending from and coupled to the spine along a first common longitudinal axis. At least two of the first set of cooling fins extend laterally from the first common longitudinal axis in a common direction and in an offset relationship to each other. Another particularly beneficial embodiment of the method of manufacturing the heat sink provides for the heat sink to be formed by stamping. This permits the use of a relatively inexpensive process to manufacture heat sinks and also permits the use of aluminum with a minimum of alloying material added.

In still another embodiment, the heat sink is formed with a second set of cooling fins extending from the spine. The second set of cooling fins is coupled to the spine along a second common longitudinal axis with at least two of the cooling fins laterally extending from the second common longitudinal axis in a common direction and in an offset relationship to each other. Another aspect of this embodiment provides for the common direction to be toward the first common longitudinal axis.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 4 illustrates a flow diagram of one embodiment of a method of manufacturing a heat sink for use on an electronic substrate to which are coupled heat generating components.

DETAILED DESCRIPTION

Figure 1A:
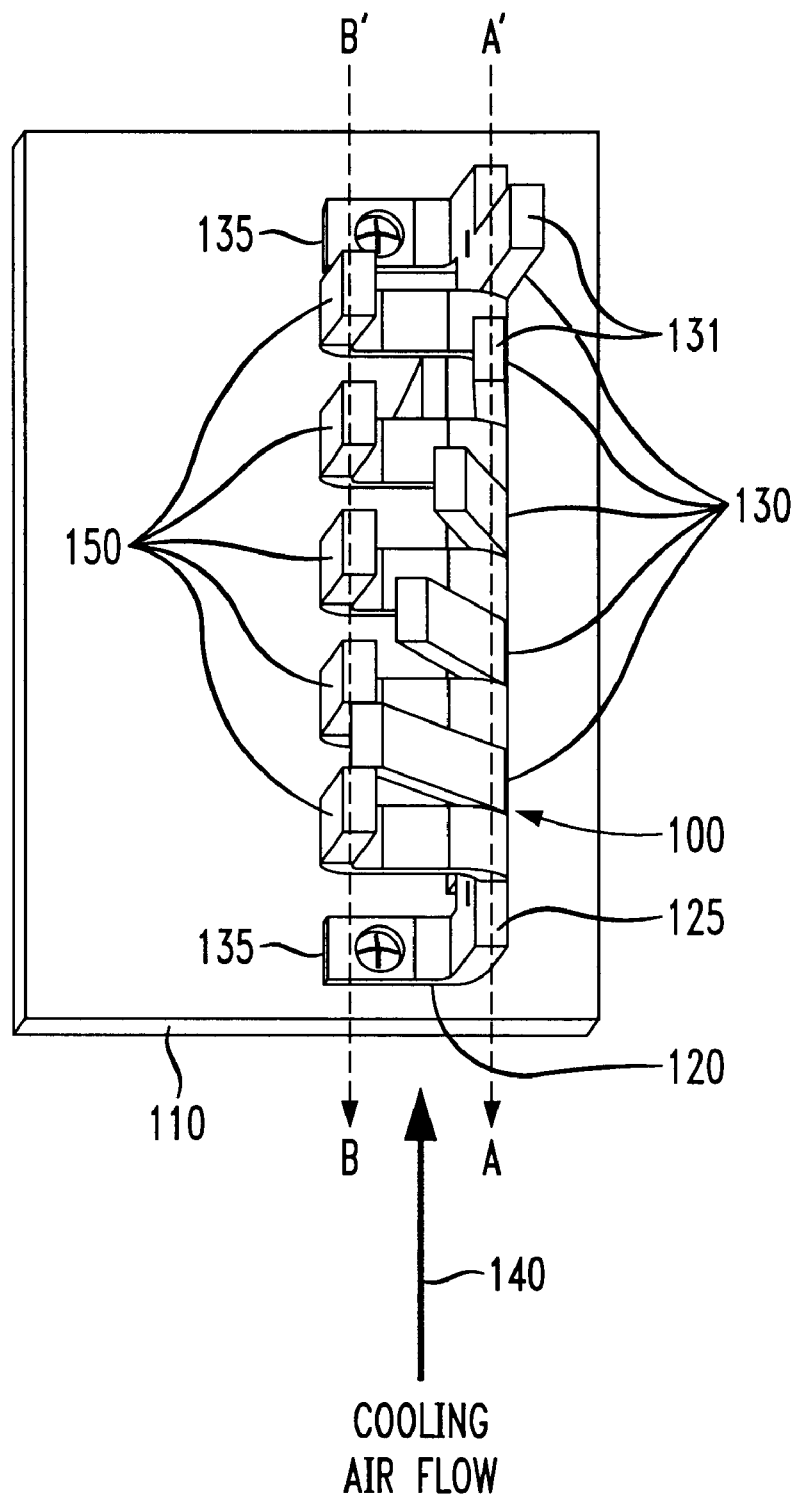
FIG. 1A illustrates a top view of a heat sink constructed in accordance with the principles of present invention.

Referring initially to FIG. 1A, illustrated is a top view of a heat sink 100 constructed in accordance with the principles of the present invention. The heat sink 100 is coupled to an electronic component substrate 110 such as a printed wiring board or printed circuit board. The heat sink 100 has a body 120 with a spine 125 configured such that, when the heat sink 100 is coupled to the substrate 110, the spine 125 is oriented parallel to the direction of an air flow 140. The substrate 110 has heat generating components (not visible) coupled to it.

Extending from the spine 125 is a first set of cooling fins 130. This first set of cooling fins 130 is coupled to the spine along a first common longitudinal axis A–A'. The individual cooling fins 131 in the first set of cooling fins 130 extend laterally from the first common longitudinal axis A–A' in a common direction and in an offset relationship to each other at successively varying angles.

The heat sink 100 has a mounting foot 135 extending laterally from the spine 125 that is configured to allow the heat sink 100 to be coupled to the substrate 110. Although the illustrated heat sink 100 has two mounting feet 135 that are used to attach the heat sink 100 to the substrate 110, those of skill in the pertinent art will recognize that any number of mounting feet 135 can be used and still be within the broad scope of the present invention.

In one embodiment of the invention, the heat sink 100 is made of aluminum. The use of unalloyed aluminum as a heat sink 100 material is particularly beneficial because of aluminum's superior heat transfer characteristics. Unalloyed aluminum can be used to manufacture the heat sink 100 described herein, because the design permits a stamping process to be used. Other manufacturing processes, such as an extrusion or die casting process, require the use of an alloyed aluminum in order to give the required working characteristics to the metal. Because the heat sink 100 can be made by a stamping process, significant cost savings are also realized because stamping processes are much cheaper than other commonly used processes of manufacturing heat sinks 100. Those skilled in the pertinent art will realize that the heat sink 100 may be manufactured using any conventional methods and still be within the broad scope of the present invention.

Figure 1B:
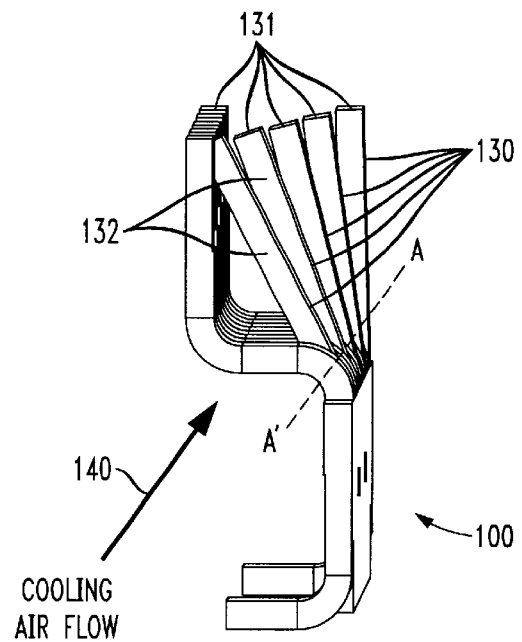
FIG. 1B illustrates an isometric view of the end of the heat sink illustrated in FIG. 1A showing the relationship of the first set of individual cooling fins to each other.

Turning now to FIG. 1B, illustrated is an isometric view of an end of the heat sink 100 showing the relationship of the first set 130 of individual cooling fins 131 to one another. In this embodiment, each cooling fin 131 in the first set 130 laterally extends from the first common longitudinal axis A–A' in a common direction and in an offset relationship to each other. Each cooling fin 131 has a leading face 132 that, in the illustrated embodiment, is oriented substantially perpendicular to the direction of the air flow 140 so that, when the fins 131 are in an offset relationship, the air flow 140 will impact the leading face 132 on each cooling fin 131. Positioning the cooling fins 131 in an offset relationship increases the overall heat transfer efficiency of the heat sink 100.

Referring again to FIG. 1A, illustrated is a second set of cooling fins 150 coupled to and extending from the spine 125 along a second common longitudinal axis B–B'. In the illustrated embodiment, the second set 150 has individual cooling fins 151 that are not offset so that space on the substrate 110 can be conserved.

Figure 1C:
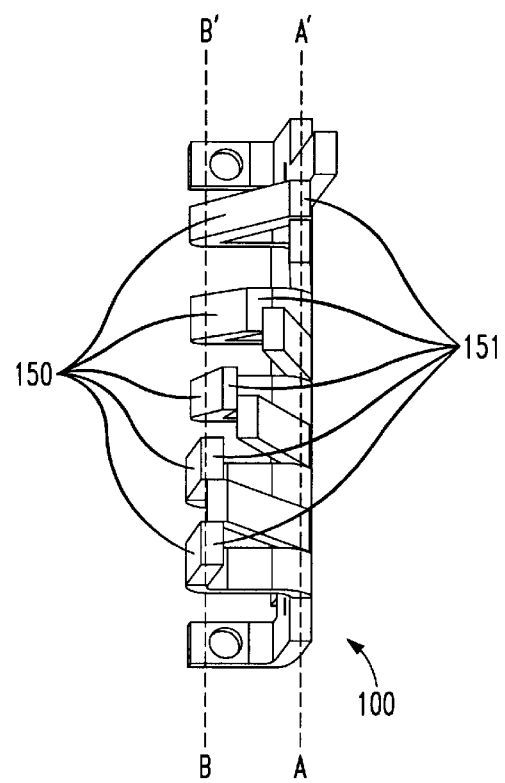
FIG. 1C illustrates an embodiment of the heat sink where individual cooling fins in the second set are offset from one another.

Turning now to FIG. 1C, illustrated is an embodiment of the heat sink where the individual cooling fins 151 in the second set 150 are also offset from one another. The second set of cooling fins 150 extend laterally from the second common longitudinal axis B–B' in a common direction and in an offset relationship to each other. The illustrated embodiment is particularly useful because the individual cooling fins 151 in the second set 150 extend in a common direction towards the first common longitudinal axis A–A', which conserves space on the substrate 110 while, at the same time, providing for an increase in cooling efficiency.

Those of skilled in the pertinent art will understand that it is within the scope of the present invention to position one heat sink 100 with offset fins 131 next to another heat sink 100 with offset fins 131 so that fins 131 on one heat sink 100 may interleave with the fins 131 on the other heat sink 100. Such a mounting arrangement may result in a further enhancement of the total heat transfer efficiency.

Figure 2A:
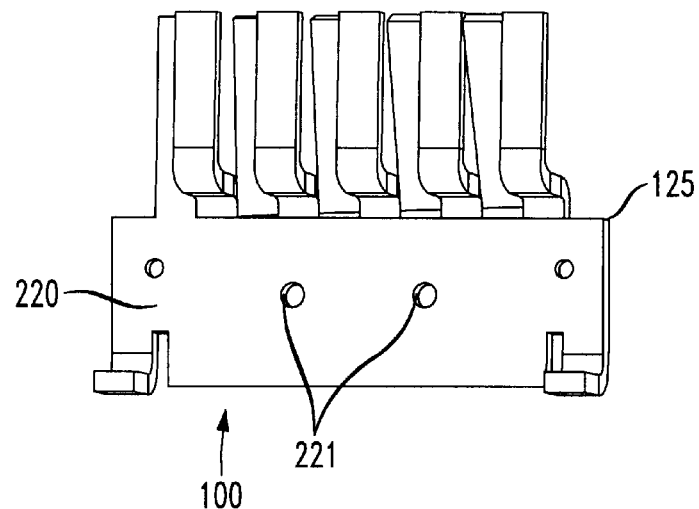
FIG. 2A illustrates an isometric view of the side of a heat sink that is configured so heat generating components can be mounted thereon.
Figure 2B:
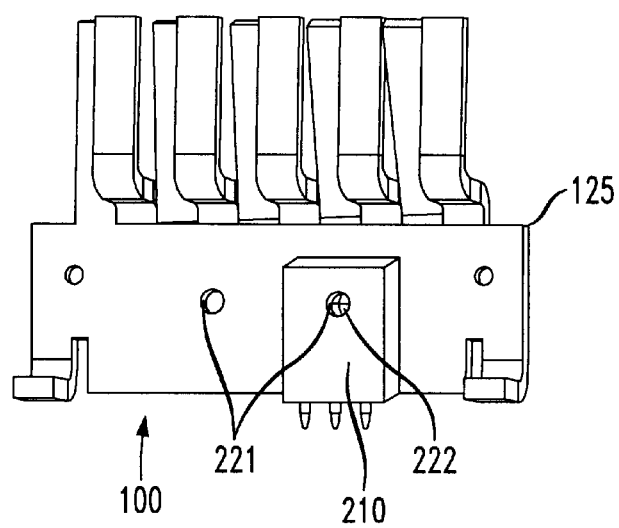
FIG. 2B illustrates the heat sink illustrated in FIG. 2A with a heat generating component mounted thereon.

Turning now to FIG. 2A, illustrated is an isometric view of one side of a heat sink 100 configured so that heat generating components 210 can be mounted thereon. The spine 125 of the heat sink 100 has a mounting surface 220 with apertures 221 to receive fasteners, such as small screws or bolts, to secure heat generating components 210 to the mounting surface 220. Turning now to FIG. 2B, illustrated is the heat sink 100 illustrated in FIG. 2A with a heat generating component 210 mounted thereon by a fastener 222 inserted through the aperture 221. The second aperture 221 can be used to receive a fastener 222 to mount a second component 225, if necessary. Those skilled in the pertinent art will understand that other methods of fastening heat generating components 210 to the mounting surface 230 can be used and still be within the scope of the present invention.

Figure 3:
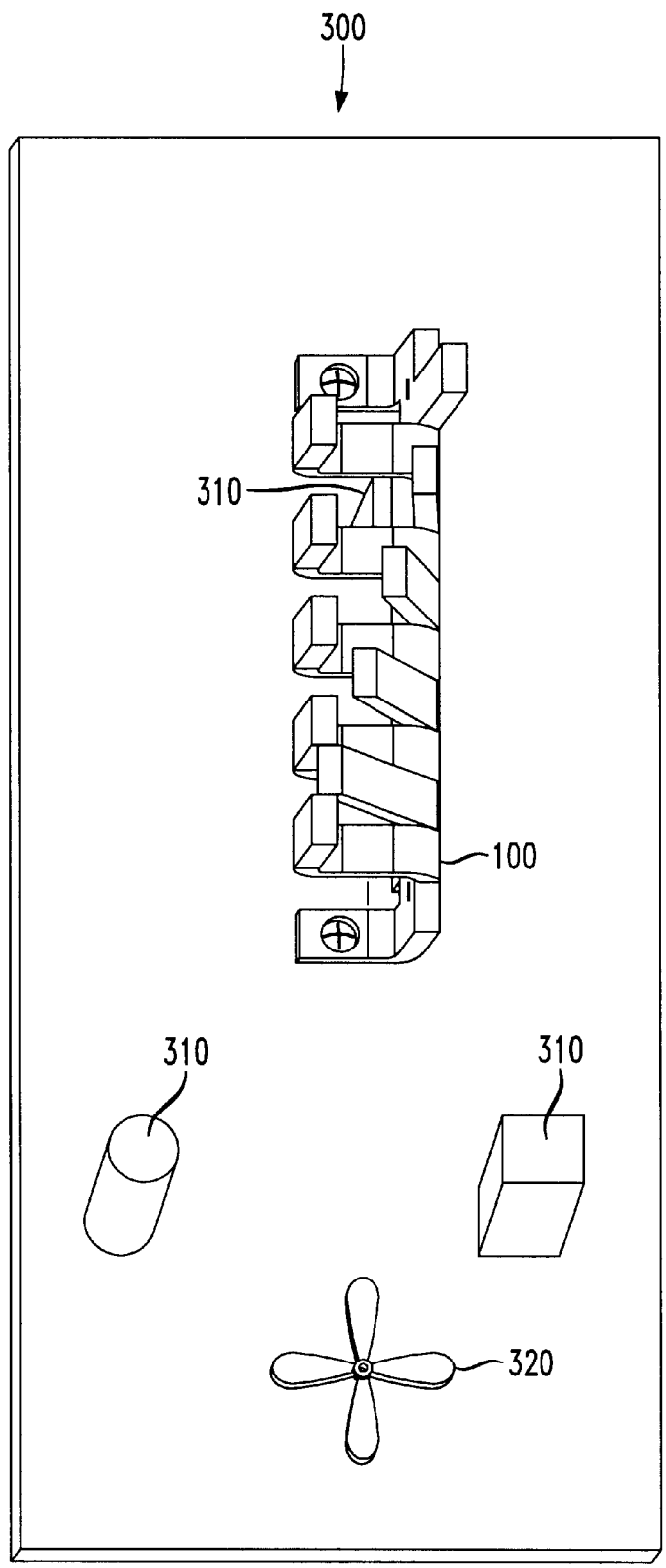
FIG. 3 illustrates an electronic device board with heat generating components, a cooling fan, and a heat sink coupled thereto.

Turning now to FIG. 3, illustrated is an electronic device board 300 with heat generating components 310 coupled thereon. Coupled to the board 300 is a fan 320 that is configured to provide an air flow to cool the heat generating components 310. Also coupled to the board 300 is an embodiment of the heat sink 100 previously described herein.

Turning now to FIG. 4, illustrated is a flow diagram of one embodiment of a method 400 of manufacturing a heat sink for use on an electronic substrate to which are coupled heat generating components. The method commences with a start step 410. In a form heat sink body step 420, a heat sink body is formed with a spine it configured to be oriented parallel with the direction of the air flow when the heat sink is coupled to a substrate. In a form first set of cooling fins step 430, a first set of cooling fins is formed that extend from and are coupled to the spine along a first common longitudinal axis. At least two of the first set of cooling fins are formed to laterally extend from a first common longitudinal axis on the heat sink in a common direction and in an offset relationship to each other. The manufacturing method concludes with an end step 440. Those skilled in the pertinent art will readily understand that additional steps covering additional embodiments of the invention can be made and that the steps providing for herein can be modified or changed and still be within the scope of the intended invention. For example, as discussed above, a particularly useful embodiment of a method to manufacture the heat sink provides for the heat sink to be formed by stamping.

Although the present invention has been described in detail, those skilled in the art should understand that they can make various changes, substitutions and alterations herein without departing from the spirit and scope of the invention in its broadest form.

What is claimed is:

1. For use with an electronic component substrate having heat generating components coupled thereto, a heat sink, comprising:

a heat sink body, said heat sink body having a spine configured to be oriented parallel with a direction of an air flow when said heat sink is coupled to said substrate; and a first set of cooling fins extending from said spine and coupled to said spine along a first common longitudinal axis, at least three of said first set of cooling fins laterally extending from said first common longitudinal axis, wherein each of said at least three fins is angularly displaced from the others of said at least three fins.

2. The heat sink as recited in claim 1 wherein said spine is configured to have at least one of said heat generating components mounted thereon.

3. The heat sink as recited in claim 1 wherein said heat sink comprises aluminum.

4. The heat sink as recited in claim 1 further comprising a mounting foot extending laterally from said spine, said mounting foot configured to couple said heat sink to said substrate.

5. The heat sink as recited in claim 1 wherein each of said first set of cooling fins laterally extends from said first common longitudinal axis and is angularly displaced from the others of said first set of cooling fins.

6. The heat sink as recited in claim 1 wherein each of said cooling fins includes a leading face oriented substantially perpendicular to said direction of said air flow and said offset relationship is such that said air flow impacts said leading face of each of said cooling fins.

7. The heat sink as recited in claim 1 further comprising a second set of cooling fins extending from said spine and coupled to said spine along a second common longitudinal axis, at least two of said second set of cooling fins laterally extending from said second common longitudinal axis and angularly displaced from the other of said at least two fins.

8. For use with an electronic component substrate having heat generating components mounted thereon, a method of manufacturing a heat sink, comprising:

forming a heat sink body having a spine configured to be oriented parallel with a direction of an air flow when said heat sink is coupled to said substrate; and forming a first set of cooling fins extending from said spine and coupled to said spine along a first common longitudinal axis, at least three of said first set of cooling fins laterally extending from said first common longitudinal, wherein each of said at least three fins is angularly displaced from the others of said at least three fins.

9. The method of manufacturing as recited in claim 8 wherein said body and said cooling fins are formed by stamping.

10. The method of manufacturing as recited in claim 8 wherein said spine is configured to have at least one of said heat generating components mounted thereon.

11. The method of manufacturing as recited in claim 8 wherein said heat sink comprises aluminum.

12. The method of manufacturing as recited in claim 8 further comprising forming a mounting foot extending laterally from said spine, said mounting foot configured to couple said heat sink to said substrate.

13. The method of manufacturing as recited in claim 8 wherein each of said first set of cooling fins laterally extends from said first common longitudinal, wherein each of said at least two fins is angularly displaced from the other of said at least two fins.

14. The method of manufacturing as recited in claim 8 wherein each of said cooling fins includes a leading face oriented substantially perpendicular to said direction of said air flow and said offset relationship is such that said air flow impacts said leading face of each of said cooling fins.

15. The method of manufacturing as recited in claim 8 further comprising forming a second set of cooling fins extending from said spine and coupled to said spine along a second common longitudinal axis, at least two of said second set of cooling fins laterally extending from said second common longitudinal axis, wherein each of said at least two fins is angularly displaced from the other of said at least two fins.

16. An electronic device board having heat generating components coupled thereon, comprising;

a fan coupled to said board, said fan configured to provide air flow to cool said heat generating components; and a heat sink coupled to said board, including:

a heat sink body, said heat sink body having a spine configured to be oriented parallel with a direction of said air flow when said heat sink is coupled to said board; and a first set of cooling fins extending from said spine and coupled to said spine along a first common longitudinal axis, at least three of said first set of cooling fins laterally extending from said first common longitudinal axis, wherein each of said at least three fins is angularly displaced from the others of said at least three fins.

17. The electronic device board as recited in claim 16 wherein said spine is configured to have at least one of said heat generating components mounted thereon.

18. The electronic device board as recited in claim 16 wherein said heat sink comprises aluminum.

19. The electronic device board as recited in claim 16 wherein said heat sink further comprises a mounting foot extending laterally from said spine, said mounting foot configured to couple said heat sink to said board.

20. The electronic device board as recited in claim 16 wherein each of said first set of cooling fins laterally extends from said first common longitudinal axis and is angularly displaced from the others of said first set of cooling fins.

21. The electronic device board as recited in claim 16 wherein each of said cooling fins includes a leading face oriented substantially perpendicular to said direction of said air flow and said offset relationship is such that said air flow impacts said leading face of each of said cooling fins.

22. The electronic device board as recited in claim 16 wherein said heat sink further comprises a second set of cooling fins extending from said spine and coupled to said spine along a second common longitudinal axis, at least two of said second set of cooling fins laterally extending from said second common longitudinal axis and angularly displaced from the other of said at least two fins.

* * * * *